United States Patent
Lu

(10) Patent No.: US 10,242,242 B2
(45) Date of Patent: Mar. 26, 2019

(54) SEMICONDUCTOR FINGERPRINT IDENTIFICATION SENSOR AND MANUFACTURING METHOD THEREOF

(71) Applicant: BOE TECHNOLOGY GROUP CO., LTD., Beijing (CN)

(72) Inventor: Jianing Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 495 days.

(21) Appl. No.: 14/762,847

(22) PCT Filed: Nov. 21, 2014

(86) PCT No.: PCT/CN2014/091825
§ 371 (c)(1),
(2) Date: Jul. 23, 2015

(87) PCT Pub. No.: WO2016/000389
PCT Pub. Date: Jan. 7, 2016

(65) Prior Publication Data
US 2016/0247009 A1    Aug. 25, 2016

(30) Foreign Application Priority Data

Jul. 4, 2014 (CN) .......................... 2014 1 0317703

(51) Int. Cl.
*H01L 23/31* (2006.01)
*G06K 9/00* (2006.01)
(Continued)

(52) U.S. Cl.
CPC ............. *G06K 9/0002* (2013.01); *G06K 9/00* (2013.01); *G06K 9/00053* (2013.01);
(Continued)

(58) Field of Classification Search
CPC ... G06K 9/0002; G06K 9/00053; H01L 23/60
See application file for complete search history.

(56) References Cited

U.S. PATENT DOCUMENTS 7,015,579 B2    3/2006 Okada et al.
8,487,624 B2    7/2013 Bredholt et al.
(Continued)

FOREIGN PATENT DOCUMENTS

CN    1533741 A    10/2004
CN    102138147 A    7/2011
(Continued)

OTHER PUBLICATIONS

International Search Report of PCT/CN2014/091825 in Chinese, dated Apr. 8, 2015 with English translation.
(Continued)

*Primary Examiner* — Chan S Park
*Assistant Examiner* — Elisa M Rice
(74) *Attorney, Agent, or Firm* — Collard & Roe, P.C.

(57) ABSTRACT

Disclosed are a semiconductor fingerprint identification sensor and a method for manufacturing the same. The semiconductor fingerprint identification sensor includes: a sensing area, a control area and an interface area; the sensing area, the control area and the interface area are communicated with one another; a fingerprint information sensed in the sensing area is sent to the control area, and is output through the interface area after being processed in the control area; the sensing area includes an insulation layer, an wiring layer, a substrate layer and a protective layer which are stacked in a sequence, the wiring layer is embedded between the insulation layer and the substrate layer, a sensor array is disposed on a side of the substrate layer being in contact with the protective layer, a via hole corresponding to the sensor array is disposed on the substrate layer, the sensor (Continued)

array is electrically connected with a sensing lead circuit of the wiring layer through the via hole. The semiconductor fingerprint identification sensor has advantages of low cost, high signal-to-noise ratio and good reliability.

16 Claims, 1 Drawing Sheet

(51) Int. Cl.
        *H01L 21/48*      (2006.01)
        *H01L 23/00*      (2006.01)
        *H01L 23/60*      (2006.01)
        *H01L 23/498*     (2006.01)

(52) U.S. Cl.
        CPC ........ *H01L 21/486* (2013.01); *H01L 23/4985* (2013.01); *H01L 23/49827* (2013.01); *H01L 23/49838* (2013.01); *H01L 23/60* (2013.01); *H01L 24/11* (2013.01); *H01L 24/17* (2013.01); *H01L 24/81* (2013.01); *H01L 23/3121* (2013.01); *H01L 2224/11462* (2013.01); *H01L 2224/16113* (2013.01); *H01L 2224/16235* (2013.01); *H01L 2224/81801* (2013.01)

(56) References Cited

U.S. PATENT DOCUMENTS

| | | | | |
|---|---|---|---|---|
| 9,851,326 | B2 * | 12/2017 | Viens | ................ G01N 27/3335 |
| 2003/0173982 | A1 | 9/2003 | Ishii et al. | |
| 2003/0215117 | A1 | 11/2003 | Hata | |
| 2004/0129787 | A1 * | 7/2004 | Saito | ...................... G06K 19/07 |
| | | | | 235/492 |
| 2004/0238821 | A1 * | 12/2004 | Yang | ..................... G01L 9/0073 |
| | | | | 257/72 |
| 2015/0153875 | A1 | 6/2015 | Zhang | |

FOREIGN PATENT DOCUMENTS

| | | |
|---|---|---|
| CN | 103294312 A | 9/2013 |
| CN | 203232406 U | 10/2013 |
| CN | 203366350 U | 12/2013 |
| CN | 104102902 A | 10/2014 |
| GB | 2 478 421 A | 9/2011 |
| WO | 01/99035 A2 | 12/2001 |

OTHER PUBLICATIONS

Notice of Transmittal of the International Search Report of PCT/CN2014/091825 in Chinese, dated Apr. 8, 2015.
Written Opinion of the International Searching Authority of PCT/CN2014/091825 in Chinese, dated Apr. 8, 2015 with English translation.
Chinese Office Action in Chinese Application No. 201410317703.7, dated Dec. 5, 2016 with English translation.
Anonymous: "Substrate (electronics)—Wikipedia", Jun. 6, 2013 (Jun. 6, 2013), XP055426399, Retrieved from the Internet: URL:https://en.wikipedia.org/w/index.php?title=Substrate (electronics)&oldid=558648030 [retrieved on Nov. 17, 2017].
European Search Report in EP 14882773.6 dated Nov. 30, 2017.

* cited by examiner

SEMICONDUCTOR FINGERPRINT IDENTIFICATION SENSOR AND MANUFACTURING METHOD THEREOF

CROSS REFERENCE TO RELATED APPLICATIONS

This application is the National Stage of PCT/CN2014/091825 filed on Nov. 21, 2014, which claims priority under 35 U.S.C. § 119 of Chinese Application No. 201410317703.7 filed on Jul. 4, 2014, the disclosure of which is incorporated by reference.

TECHNICAL FIELD

Embodiments of the present invention relate to a semiconductor fingerprint identification sensor and a method for manufacturing the same.

BACKGROUND

At present, the existing fingerprint identification sensors mainly include optical fingerprint identification sensors, surface acoustic wave (SAW) fingerprint identification sensors and semiconductor identification fingerprint sensors, etc.

The principle of an optical fingerprint identification sensor is the principle of optical photography and reflection, it has the advantages of strong antistatic capacity, low cost and long service life, and its disadvantages are high light dependence, failing to recognize fake fingers, and poor applicability of dry-wet fingers, etc.

A SAW fingerprint identification sensor has disadvantages of large volume and high power consumption, etc.

A semiconductor fingerprint identification sensor mainly uses the principle of capacitance, inductance, temperature or pressure to achieve fingerprint image collection. As the most promising fingerprint sensor, the semiconductor fingerprint identification sensor has been more and more focused by people because of the advantages of high recognition rate (can recognize the fake fingers), small size and low power consumption. But its disadvantages are obvious: using single-crystal silicon as the sensor results in high cost, low signal-to-noise ratio, and poor reliability, etc. The sensing unit of the existing semiconductor fingerprint identification sensor is made of single-crystal silicon substrate; the price is calculated according to the size of single-crystal silicon substrate, so that the cost is rising sharply by increasing the sensor area.

SUMMARY

According to a respect of the present invention, there is provided a semiconductor fingerprint identification sensor, which comprises: a sensing area, a control area and an interface area. The sensing area, the control area and the interface area are communicated with one another. Fingerprint information sensed in the sensing area is sent to the control area, and is output through the interface area after being processed in the control area. The sensing area comprises an insulation layer, an wiring layer, a substrate layer and a protective layer which are stacked in a sequence, the wiring layer is embedded between the insulation layer and the substrate layer, a sensor array is disposed on a side of the substrate layer being in contact with the protective layer, a via hole which corresponds to the sensor array is disposed on the substrate layer, the sensor array is electrically connected with a sensing lead circuit of the wiring layer through the via hole.

As an example, the insulation layer and the substrate layer are made from a flexible insulating material.

As an example, the sensor array is made from a high conductivity material.

As an example, the protective layer is made from a material with a high dielectric constant and high hardness.

As an example, the control area comprises an insulation layer, an wiring layer and a substrate layer which are stacked in a sequence, the wiring layer is embedded between the insulation layer and the substrate layer; a plurality of bonding joints are disposed on a side of the substrate layer away from the insulation layer, a bonding pad is composed of a plurality of bonding joints, bonding pad via holes which corresponds to the bonding joints are disposed on the substrate layer, the bonding joints are electrically connected with a sensing lead circuit of the wiring layer through the bonding pad via holes.

As an example, a fingerprint identification sensor integrated circuit is welded in the control area.

As an example, the interface area comprises an insulation layer, an wiring layer and a substrate layer which are stacked in a sequence, the wiring layer is embedded between the insulation layer and the substrate layer, a plurality of interface contacts are disposed on a side of the substrate layer away from the insulation layer, interface via holes which correspond to the interface contacts are disposed on the substrate layer, the interface contacts are electrically connected with a sensing lead circuit of the wiring layer through the interface via holes.

As an example, the semiconductor fingerprint identification sensor further comprises an electro-static discharge loop, wherein the electro-static discharge loop surrounds the sensing area.

As an example, the electro-static discharge loop comprises a notch.

According to another respect of the present invention, there is provided a method for manufacturing the semiconductor fingerprint identification sensor, which comprises:

cutting a flexible substrate;

drilling a through hole on the flexible substrate, and forming a metal layer on a surface of the flexible substrate, such that an electrically conductive via hole is formed by metalizing the through hole;

forming a photosensitive film layer on the metal layer, and forming a sensing lead circuit of an wiring layer by a pattern process;

coating an insulation layer on the sensing lead circuit;

electroplating a sensor array, an integrated circuit bonding pad and an interface contact on a surface of the flexible substrate away from the wiring layer to form a sensing area, a control area and an interface area respectively; and forming a protective layer on a top surface of the flexible substrate.

As an example, the insulation layer and the flexible substrate are made from a flexible insulating material.

As an example, the sensor array is made from a high conductivity material.

As an example, the protective layer is made from a material with a high dielectric constant and high hardness.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiments, without any inventive work, which should be within the scope of the invention.

Figure 1:
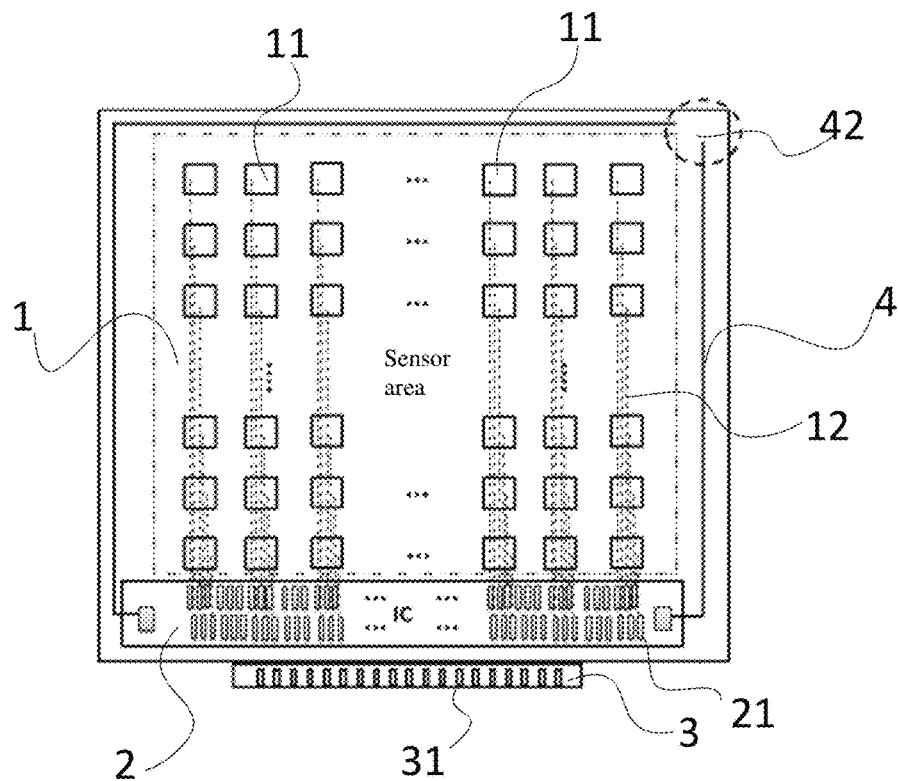
FIG. 1 schematically illustrates a configuration of a semiconductor fingerprint identification sensor in accordance with an embodiment of the invention.

As illustrated in FIG. 1, an embodiment of the present invention provides a semiconductor fingerprint identification sensor, which comprises: a sensing area 1, a control area 2 and an interface area 3; the sensing area 1, the control area 2 and the interface area 3 are communicated with one another; a fingerprint information sensed in the sensing area 1 is sent to the control area 2, and is output through the interface area 3 after the information is processed in the control area 2.

Figure 2:
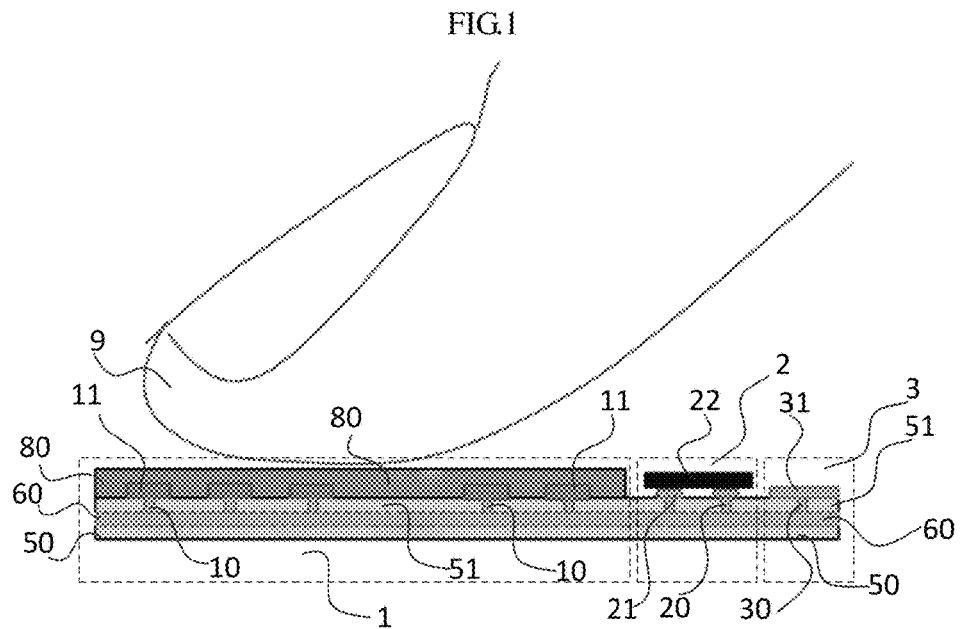
FIG. 2 schematically illustrates a cross-section view of a configuration of a semiconductor fingerprint identification sensor in accordance with an embodiment of the invention.

As illustrated in FIG. 2, the sensing area 1 comprises an insulation layer 50, a wiring layer 60, a substrate layer 51 and a protective layer 80 which are stacked in a sequence. The wiring layer 60 is embedded between the insulation layer 50 and the substrate layer 51. A sensor array 11 is disposed on a side of the substrate layer 51 in contact with the protective layer 80. A electrically conductive via hole 10 corresponding to the sensor array 11 is disposed on the substrate layer 51, and the sensor array 11 is electrically connected with a sensing lead circuit 12 of the wiring layer 60 through the via hole 10. The semiconductor fingerprint identification sensor is described in detail as below.

As an example of the present invention, both the insulation layer 50 and the substrate layer 51 in the sensing area 1 are made from a flexible insulating material, such as polyimide or polyester film. The protective layer 80 is made from a material with a high dielectric constant and high hardness, such as $Si_3N_4$ or polytetrafluoroethene (PTFE), etc. For example, the high dielectric constant and high hardness material is deposited on a top surface of the substrate layer 51 by means of sputtering, evaporation or the like to form the protective layer 80. For example, the thickness of the protective layer 80 is less than 5 μm.

For example, the protective layer 80 is made from $Si_3N_4$, due to $Si_3N_4$ with high dielectric constant and ultra-thin thickness, the capacitance signal variation cannot be too small while the finger contacts the sensor array 11. Moreover, the reliability of the sensor is increased due to $Si_3N_4$ with good wear-resisting property.

The sensor array 11 disposed in the sensing area 1 comprises a plurality of semiconductor sensor units which are arranged in an N×N array. The number of the semiconductor sensor unit per inch, for example, is more than 300, to ensure the identification accuracy. The sensor array 11 is made from high conductivity material, such as copper and silver. As an example, the sensor array 11 is made from copper. The fingerprint information sensed in the sensor array 11 is sent to the control area 2 through the via hole 10 disposed on the substrate layer 51 and a sensing lead circuit 12 disposed in the wiring layer 60. Every lead in the wiring layer 60 does not intersect each other, thus the parasitic capacitance is minimized. A printed circuit is used as the sensing lead circuit 12 in the wiring layer 60, for example, the material of the printed circuit is liquid silver.

As an example of the present invention, as illustrated in FIG. 2, the control area 2 comprises an insulation layer 50, a wiring layer 60 and a substrate layer 51 which stacked in a sequence. The wiring layer 60 is embedded between the insulation layer 50 and the substrate layer 51. A plurality of bonding spots 21 are disposed on a side of the substrate layer 51 away from the insulation layer 50, and a bonding pad is composed of the plurality of bonding joints 21. Bonding pad via holes 20 which correspond to the bonding joints 21 are disposed on the substrate layer 51, and the bonding joints 21 are electrically connected with a sensing lead circuit 12 of the wiring layer 60 through the bonding pad via holes 20. A fingerprint identification sensor integrated circuit 22 is welded in the control area 2. Fingerprint information collected in the sensing area 1 is identified and processed by the fingerprint identification sensor integrated circuit 22 in the control area 2 to become a fingerprint image, and then the image is output through the interface area 3. A fingerprint identification sensor circuit comprises: the sensor array 11 and each sensing lead circuit 12 of the wiring layer in the sensing area 1, and the fingerprint identification sensor integrated circuit 22 in the control area 2.

As illustrated in FIG. 2, the interface area 3 comprises an insulation layer 50, a wiring layer 60 and a substrate layer 51 which stacked in a sequence. The wiring layer 60 is embedded between the insulation layer 50 and the substrate layer 51. A plurality of interface contacts 31 are disposed on a side of the substrate layer 51 away from the insulation layer 50. Interface via holes 30 which correspond to the interface contacts 31 are disposed on the substrate layer 51, and the interface contacts 31 are electrically connected with a sensing lead circuit 12 of the wiring layer 60 through the interface via holes 30.

As illustrated in FIG. 1 and FIG. 2, the sensing area 1, the control area 2 and the interface area 3 may be integrally molded; the insulation layer 50, the wiring layer 60 and the substrate layer 51 in the sensing area 1, the control area 2 and the interface area 3 may be made from the same material respectively. For example, the sensing area 1, the control area 2 and the interface area 3 are integrally molded to form an FPC (Flexible Printed Circuit board) together.

As illustrated in FIG. 1, the semiconductor fingerprint identification sensor further comprises an ESD (Electro-Static Discharge) loop 4, the ESD loop 4 surrounds the sensing area 1. In order to avoid the antenna loop effect, the ESD loop 4 is designed as segments, and the ESD loop 4 has a notch 42. The ESD loop 4 is made from a metal conductive material such as copper, nickel, or silver, etc. and wraps the whole sensor area, and is connected with an IC bonding pad. After the loop 4 is bonding to the IC, it is connected to the ground lead in the IC. In case static electricity is generated, it could be led to the ground by IC through the metallic conductor, and then the static is discharged, and that the damage and impact from static electricity on the sensor area is reduced. In addition, if the loop is a closed loop, the loop antenna effect will be caused, and then the detection of sensor signal is influenced. Hereby, the segment design is used, the notch 42 is added, and the size of the notch is designed depending on the specific requirements, for example, the width of the notch is at least 30 μm.

Another embodiment of the present invention provides a method for manufacturing the semiconductor fingerprint identification sensor, which comprises:

cutting a flexible substrate, for example, the substrate in rolls is cut to a desired size according to the specific requirements;

drilling a through hole on the flexible substrate by chemical etching or laser etc., metalizing the through hole (the metal is a high conductivity material such as cooper, or, silver, etc.) by chemical plating or carbon conductive layer electroplating to form an electrically conductive via hole, and a metal layer is also formed on a surface of the flexible substrate;

cleansing the surface of the metal layer by chemical or mechanical method, forming a photosensitive film layer on the metal layer, and forming a sensing lead circuit of a wiring layer by a pattern process, for example, it is subjected to ultraviolet exposure, development by using developer, etching and peeling processes.

coating an adhesive, such as polyimide, on the sensing lead circuit, forming an insulation layer after partially curing the adhesive, and linking the insulation layer with the wiring layer closely by hot-pressing and leaving no air bubbles;

after cleansing a surface of the flexible substrate away from the wiring layer, electroplating a sensor array, an integrated circuit bonding pad (IC Bonding Pad) and an interface contact (also known as an interface golden finger) on the surface to form a sensing area, a control area and an interface area respectively; and forming a protective layer on a top surface of the flexible substrate, by depositing the high dielectric constant and high hardness material using sputtering, evaporation, etc. For example, the thickness of the protective layer is less than 5 μm.

after manufacturing the semiconductor fingerprint identification sensor, welding a sensor integrated circuit in the control area and testing the sensor.

For example, punching and cutting a large flexible sensor into small pieces, reinforcing the control area with a reinforcement plate; coating ACF (Anisotropic Conductive Film) after cleansing the IC bonding pad; welding IC on the sensor after subjected to pre-bonding and bonding; finally performing lead check and testing electrical performance.

According to the method for manufacturing the semiconductor fingerprint identification sensor provided in an embodiment of the present invention, the sensor pad is prepared on the flexible substrate, so the process cost is greatly reduced. IC is bonded on FPC, which is similar to COF (Chip on Film), and then the process is simplified and the process cost is greatly reduced.

Embodiments of the present invention relate to a semiconductor fingerprint identification sensor and a method for manufacturing the same, a sensor array is prepared on a flexible substrate, in comparison with the traditional common semiconductor fingerprint sensor in which the sensor unit is prepared on a single crystal silicon substrate, the price competitiveness is enhanced by using cheaper flexible substrate. Further, the process is simplified by using IC bonding similar to COF. Because the flexible substrate is provided with metal wirings (which is made from high conductivity metal material, such as cooper, or silver, etc.), the signal loss is reduced and the signal-to-noise ratio is increased. The substrate is covered by the protective layer of the high dielectric constant material, in order to improve the sensor reliability. An ESD loop is designed for the semiconductor fingerprint identification sensor, in order to prevent the fingerprint signal from interference.

What is described above is related to the illustrative embodiments of the disclosure only and not limitative to the scope of the disclosure; the scopes of the disclosure are defined by the accompanying claims.

The present application claims the priority of Chinese patent application No. 201410317703.7 filed on Jul. 4, 2014, the disclosure of which is incorporated herein by reference in its entirety.

The invention claimed is:

1. A semiconductor fingerprint identification sensor, comprising: a sensing area, and a control area;
   wherein the sensing area and the control area are in communication with each other,
   and a fingerprint information sensed in the sensing area is sent to the control area,
   wherein the sensing area comprises an insulation layer, an wiring layer, a substrate layer and a protective layer which are stacked in a sequence, the wiring layer is embedded between the insulation layer and the substrate layer, a sensor array is disposed on a side of the substrate layer being in contact with the protective layer, a via hole which corresponds to the sensor array is disposed on the substrate layer, the sensor array is electrically connected with a sensing lead circuit of the wiring layer through the via hole,
   wherein the wiring layer and the insulation layer are disposed on an opposite side of the substrate layer away from the sensor array,
   wherein the fingerprint information sensed in the sensing area is sent to the control area through the via hole and a sensing lead circuit of the wiring layer, and
   wherein the control area comprises a fingerprint identification sensor integrated circuit welded in the control area and disposed on same side of the substrate layer as the sensor array, the fingerprint identification sensor integrated circuit is configured to identify and process the fingerprint information sensed in the sensing area so as to form a fingerprint image.

2. The semiconductor fingerprint identification sensor according to claim 1, wherein the insulation layer and the substrate layer are made from a flexible insulating material.

3. The semiconductor fingerprint identification sensor according to claim 1, wherein the sensor array is made from a high conductivity material.

4. The semiconductor fingerprint identification sensor according to claim 1, wherein the protective layer is made from a material with a high dielectric constant and high hardness.

5. The semiconductor fingerprint identification sensor according to claim 1, wherein the control area comprises an insulation layer, an wiring layer and a substrate layer which are stacked in a sequence, the wiring layer is embedded between the insulation layer and the substrate layer;
   a plurality of bonding joints are disposed on a side of the substrate layer away from the insulation layer, a bonding pad is composed of a plurality of bonding joints, bonding pad via holes which corresponds to the bonding joints are disposed on the substrate layer, the bonding joints are electrically connected with a sensing lead circuit of the wiring layer through the bonding pad via holes.

6. The semiconductor fingerprint identification sensor according to claim 1, further comprising an interface area, wherein the interface area is in communication with both the sensing area and the control area, and configured to output the fingerprint image, wherein the interface area comprises an insulation layer, an wiring layer and a substrate layer which are stacked in a sequence, the wiring layer is embedded between the insulation layer and the substrate layer, a plurality of interface contacts are disposed on a side of the substrate layer away from the insulation layer, interface via holes which correspond to the interface contacts are disposed on the substrate layer, the interface contacts are electrically connected with a sensing lead circuit of the wiring layer through the interface via holes.

7. The semiconductor fingerprint identification sensor according to claim 1, further comprising: an electro-static discharge loop, wherein the electro-static discharge loop surrounds the sensing area.

8. The semiconductor fingerprint identification sensor according to claim 7, wherein the electro-static discharge loop comprises a notch.

9. A method for manufacturing a semiconductor fingerprint identification sensor, comprising:
cutting a flexible substrate;
drilling a through hole on the flexible substrate, and forming a metal layer on a surface of the flexible substrate, such that an electrically conductive via hole is formed by metalizing the through hole;
forming a photosensitive film layer on the metal layer, and forming a sensing lead circuit of a wiring layer by a pattern process;
coating an insulation layer on the sensing lead circuit;
electroplating a sensor array, an integrated circuit bonding pad and an interface contact on a surface of the flexible substrate away from the wiring layer to form a sensing area, a control area and an interface area respectively; and
forming a protective layer on a top surface of the flexible substrate,
wherein the wiring layer and the insulation layer are formed on an opposite side of the flexible substrate away from the sensor array,
wherein a fingerprint information sensed in the sensing area is sent to the control area through the electrically conductive via hole and the sensing lead circuit of the wiring layer, and
wherein a fingerprint identification sensor integrated circuit is welded in the control area and formed on same side of the flexible substrate as the sensor array, the fingerprint identification sensor integrated circuit is configured to identify and process the fingerprint information sensed in the sensing area so as to form a fingerprint image.

10. The method for manufacturing the semiconductor fingerprint identification sensor according to claim 9, wherein the insulation layer and the flexible substrate are made from a flexible insulating material.

11. The method for manufacturing the semiconductor fingerprint identification sensor according to claim 9, wherein the sensor array is made from a high conductivity material.

12. The method for manufacturing the semiconductor fingerprint identification sensor according to claim 9, wherein the protective layer is made from a material with a high dielectric constant and high hardness.

13. The semiconductor fingerprint identification sensor according to claim 5, further comprising: an electro-static discharge loop, wherein the electro-static discharge loop surrounds the sensing area.

14. The semiconductor fingerprint identification sensor according to claim 1, further comprising: an electro-static discharge loop, wherein the electro-static discharge loop surrounds the sensing area.

15. The semiconductor fingerprint identification sensor according to claim 6, further comprising: an electro-static discharge loop, wherein the electro-static discharge loop surrounds the sensing area.

16. A semiconductor fingerprint identification sensor, comprising: a sensing area, a control area and an interface area;
wherein the sensing area and the control area are in communication with each other, and
a fingerprint information sensed in the sensing area is sent to the control area,
wherein the sensing area comprises an insulation layer, an wiring layer, a substrate layer and a protective layer which are stacked in a sequence, the wiring layer is embedded between the insulation layer and the substrate layer, a sensor array is disposed on a side of the substrate layer being in contact with the protective layer, a via hole which corresponds to the sensor array is disposed on the substrate layer, the sensor array is electrically connected with a sensing lead circuit of the wiring layer through the via hole; wherein the via hole is located beneath the sensor array,
wherein the wiring layer and the insulation layer are disposed on an opposite side of the substrate layer away from the sensor array,
wherein the fingerprint information sensed in the sensing area is sent to the control area through the via hole and a sensing lead circuit of the wiring layer, and
wherein the control area comprises a fingerprint identification sensor integrated circuit welded in the control area and disposed on same side of the substrate layer as the sensor array, the fingerprint identification sensor integrated circuit is configured to identify and process the fingerprint information sensed in the sensing area so as to form a fingerprint image.

* * * * *